United States Patent [19]

Hong

[11] Patent Number: 5,625,600
[45] Date of Patent: Apr. 29, 1997

[54] FLASH MEMORY ARRAY WITH SELF-LIMITING ERASE

[75] Inventor: Gary Hong, Hsinchu, Taiwan

[73] Assignee: United Microelectronics Corporation, Hsinchu, Taiwan

[21] Appl. No.: 435,326

[22] Filed: May 5, 1995

[51] Int. Cl.$^6$ ............................................. G11C 16/02
[52] U.S. Cl. ................... 365/218; 365/185.33; 365/185.3; 365/185.29
[58] Field of Search ........................... 365/182, 185, 365/900, 218

[56] References Cited

U.S. PATENT DOCUMENTS

| | | | |
|---|---|---|---|
| 4,797,856 | 1/1989 | Lee et al. | 365/218 |
| 5,220,528 | 6/1993 | Mielke | 365/900 |
| 5,241,507 | 8/1993 | Fong | 365/218 |
| 5,357,466 | 10/1994 | Hong | 365/218 |
| 5,428,578 | 6/1995 | Kaya et al. | 365/218 |

*Primary Examiner*—Viet Q. Nguyen
*Attorney, Agent, or Firm*—Cushman Darby & Cushman IP Group of Pillsbury Madison & Sutro, LLP

[57] ABSTRACT

A flash memory array with self-limiting erase for preventing over-erasure utilizes a self-limiting-rase floating gate transistor coupled to the memory array or to each row of memory cells. The self-limiting-erase transistor has a smaller threshold voltage than the memory cells. When all memory cells or one row of memory cells are erased, the drain of the transistor is connected via a feedback path to all word lines of the memory array or to the corresponding word line for that row of memory cells. When the self-limiting-erase transistor is turned on due to full erasing, the potential of the word lines is pulled up to the erasing voltage which is applied at the sources of the memory cells, thereby the erase operation is stopped automatically.

13 Claims, 2 Drawing Sheets

FLASH MEMORY ARRAY WITH SELF-LIMITING ERASE

BACKGROUND OF THE INVENTION

The present invention relates to a non-volatile memory array, and more particularly to a flash memory array with self-limiting erase to prevent over-erasing.

The fabrication of flash memories or electrically erasable programmable read only memories (EEPROMs) utilizing metal oxide semiconductor (MOS) technology is well known in the prior art. These EEPROMs employ memory cells utilizing floating gates which are generally formed from polysilicon and which are completely surrounded by an insulator. Electrical charge is transferred to and removed from the floating gate to control the threshold voltage of one or more MOS transistors in a memory cell. A floating gate is "programmed" when a charge is stored on it. The cell is "unprogrammed" or "erased" when the floating gate is discharged.

A problem with the single transistor flash cell or single-transistor EEPROM cell is over-erasure. An over-erasing condition occurs when, as a result of erase, the floating gate potential is sufficiently high during a read operation that an unselected cell conducts current, thereby providing an erroneous reading. A proposed solution to the over-erasing problem is to add an additional transistor to each cell to block output of erroneous data resulting from the over-erased floating gate. This two-transistor cell then forms each EEPROM memory cell.

However, there are drawbacks to this proposed solution. One such drawback is that EEPROM memory cells require sophisticated manufacturing processes. Increasing their complexity increases their cost of manufacture. Another drawback is that EEPROM memory cells requiring two transistors per cell require more surface area on a silicon wafer than is required by a single transistor cell, thereby decreasing the number of cells that can be obtained for a predetermined area which also increases cost.

One approach to simplifying the EEPROM memory cell has been to use a split-gate memory cell that is essentially the EEPROM memory cell combined into a hybrid two transistor design that requires less area on a silicon wafer. The manufacturing process for the split-gate transistor is less sophisticated than that for the EEPROM memory cell, but is still more sophisticated than that for a single transistor memory cell. Furthermore, the split-gate cell also requires more area than a single transistor cell.

U.S. Pat. No. 5,357,466, issued Oct. 18, 1994 to the present inventor, assigned to United Microelectronics Corporation, discloses a flash memory cell with a self-limiting erase to prevent the floating gate from being over-erased. The subject matter of that patent is hereby incorporated by reference as if fully set forth herein.

The memory cell of the '466 patent comprises first and second MOS transistors. The first and second transistors have a common source, first and second separate drains, a common floating gate and a common control gate. The first transistor has a higher threshold voltage than the second transistor. A feedback path is provided between the drain of the second transistor and the common control gate to limit the discharge to prevent over-erasing. This flash memory cell, however, requires more silicon wafer area than a single transistor cell.

U.S. Pat. No. 5,241,507, issued Aug. 31, 1993 to Vincent Fong, also incorporated herein by reference as if fully set forth herein, discloses a single-transistor flash memory array employing prevention circuitry for minimizing the effect of any floating gates in an over-erased state when accessing data stored in the memory array device. The prevention circuit includes a column line coupling a current limiting device in each row together in a common column. The memory array device also employs a row current limiting device which couples arrow of flash cells to the erase potential. The second row switching is activated to prevent a false signal generated by an over-erased flash cell in the same column as a selected flash cell is being accessed for data from masking the data retrieval from the desired flash cell. As a result of employing the prevention circuit, the flash memory array can employ single transistor floating gate memory cells which are susceptible to being over-erased during erase operation. Thus, despite the necessity of adding five transistors for every two rows of memory cells, the overall density of the memory array is enormously increased over memory arrays of the prior art which required two transistors per memory cell. This patented method, however, still cannot prevent the floating gates from being over-erased.

Therefore, what is needed is a non-volatile memory array employing single-transistor memory cells that does not exhibit the over-erasing problem.

SUMMARY OF THE INVENTION

The primary object of the present invention is to provide a non-volatile memory array having a self-limiting erase to prevent over-erasure.

Another object is to provide such an array that can be manufactured relatively inexpensively.

A further object is to provide such an array that can be made with a high integration density.

The present invention provides such an array. The array according to the present invention includes a plurality of single transistor memory cells organized into rows and columns. Each memory cell has a source, a drain, a floating gate and a control gate. The control gates of all memory cells in each row are interconnected by a word line, the drains of all memory cells in each column are interconnected by a bit line, and the sources of the memory cells are interconnected by a source line. A self-limiting-erase floating gate transistor is coupled to each row of memory cells. Its control gate is coupled to the corresponding word line for that row, and its source coupled to the source line. A feedback circuit is provided for connecting the drain of the self-limiting-erase floating gate transistor to the corresponding word line in order to limit the erase operation when that row of memory cells is erased. The self limiting transistor has a lower threshold voltage than that of the memory cell transistors. When a row of memory cells is being erased, the drain of the self-limiting-erase floating gate transistor for the row being erased is coupled via a feedback path to a common word line formed by the interconnection of the control gates of the erased row of memory cell transistors. When the threshold voltage of the self-limiting-erase transistor reaches approximately zero volts due to erasing, the self-limiting-erase transistor is turned on, and the potential of the common word line, i.e. the control gates of this row of memory cell transistors, is pulled up to the erasing voltage. Therefore, tunneling erase is automatically stopped, and over-erasure of the memory cells is avoided.

In an alternative embodiment of the invention, a self-limiting-erase floating gate transistor is coupled to an array of single transistor memory cells. This self-limiting-erase floating gate transistor has a lower threshold voltage than that of the memory cell transistors. When all memory cells in the memory array are being erased, the drain of the self-limiting-erase floating gate transistor is coupled via a feedback path to the control gates of all of the memory cell transistors. When the threshold voltage of the self-limiting-erase transistor reaches approximately zero volts due to erasing, the self-limiting-erase transistor is turned on, and the potential of the control gates is pulled up to the erasing voltage. Therefore, tunneling erase operation is automatically stopped, and over-erasure of the memory cells is avoided.

In accordance with one aspect of the present invention, the feedback circuit includes an impedance element connected between the drain of the self-limiting-erase floating gate transistor and the corresponding word line.

In accordance with another aspect of the present invention, the feedback circuit includes a feedback path disposed in each row of the memory cells for connecting the drain of the corresponding self-limiting-erase floating gate transistor to the corresponding word line when one row of the memory cells is erased. Each of the feedback paths includes an impedance element connected between the drain of the corresponding self-limiting-erase transistor and the corresponding word line.

In accordance with a further aspect of the present invention, the memory cells have a higher threshold voltage than the self-limiting-erase floating gate transistors. The difference between the threshold voltages of the memory cells and the self-limiting-erase floating gate transistors is in the range of approximately 0.1 to 1 volts. The threshold voltage difference may be obtained by implanting ions of different dosages into the channel regions of the memory cells and the self-limiting-erase floating gate transistors. An alternative way to obtain the desired threshold difference is by electrically programming the memory cells to increase their threshold voltages.

In accordance with another embodiment of the invention, a non-volatile memory array comprises a plurality of memory cells arranged in rows and columns; a switching circuit; a self-limiting-erase floating gate transistor disposed in the memory array with its control gate coupled to the word lines via the switching circuit, and its source coupled to the source line; and a feedback circuit for connecting the drain of the self-limiting-erase floating gate transistor to the word lines in order to limit the erase operation when the memory cells are erased.

In accordance with yet another aspect of the present invention, the switching circuit comprises an OR gate having input terminals connected to the word lines, and an output terminal connected to the control gate of the self-limiting-erase floating gate transistor.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 1:
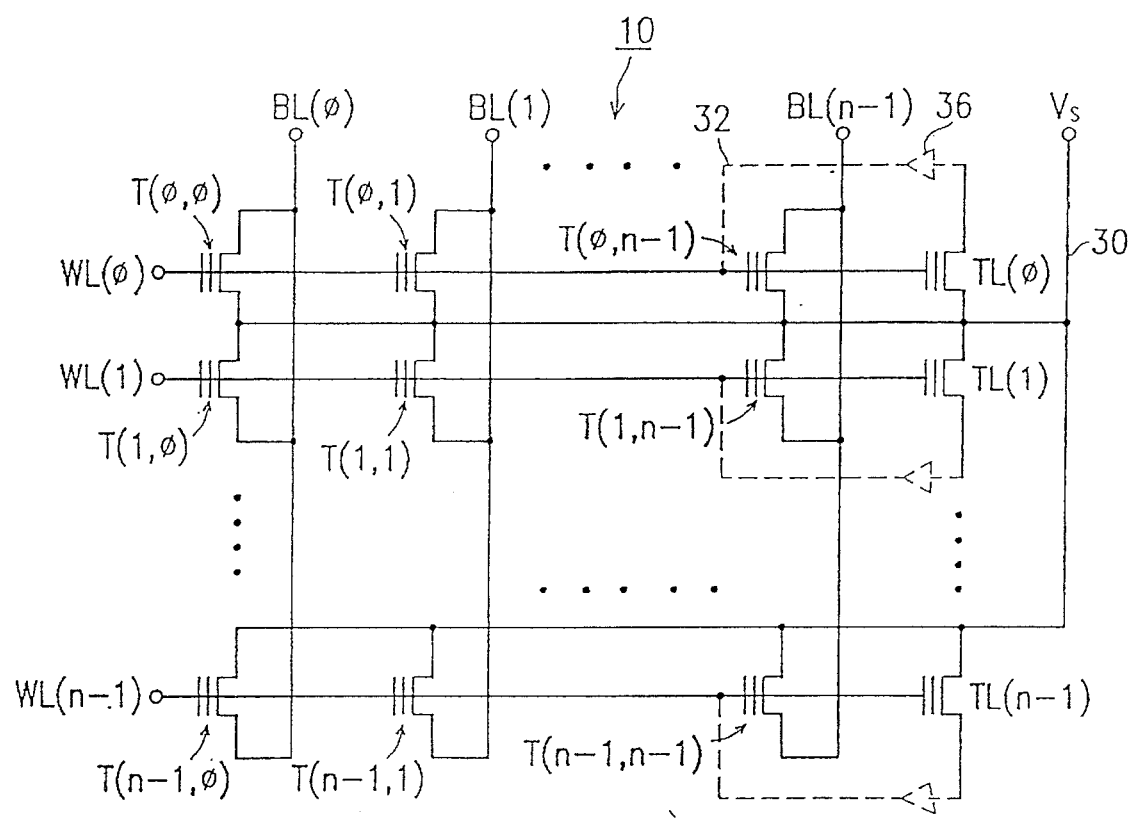
FIG. 1 is an electrical schematic diagram of a non-volatile memory array having a self-limiting erase to prevent over-erase, according to one preferred embodiment of the present invention.
Figure 3:
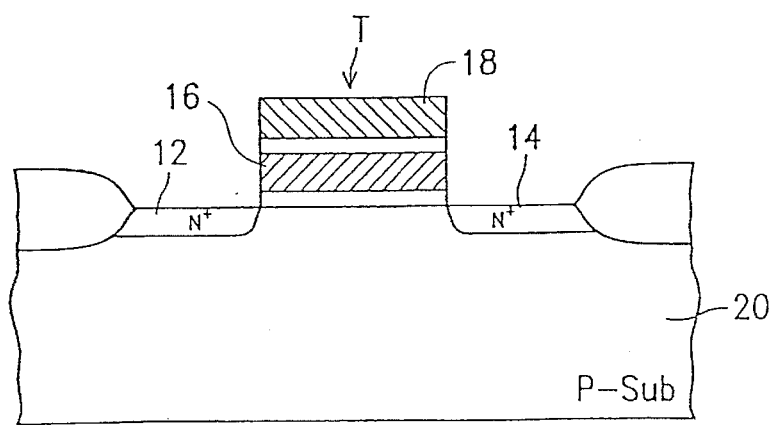
FIG. 3 is a schematic cross-section of a one transistor memory cell used in the memory array shown in FIG. 1.

Referring now to FIG. 1, there is shown a schematic diagram of a flash memory cell array structure 10, according to one preferred embodiment of the present invention. The memory array 10 is an N×N array having N rows by N columns of memory cells $T(\phi,\phi)$ through $T(\phi,n-1)$, $T(1,\phi)$ through $T(1,n-1)$, . . ., and $T(n-,\phi)$ through $T(n-1,n-1)$. Each memory cell T is a flash transistor device having drain, source and control gate nodes, and a floating gate. Each memory cell T is preferably a conventional single-transistor flash cell like that shown in FIG. 3. Transistor T is an N-channel MOS having an $N^+$ source region 12 and an $N^+$ drain region 14 formed in the surface of a $P^-$ silicon substrate 20, and a floating gate 16 and a control gate 18 formed in stacked fashion on the silicon substrate 20. Floating gate 16 stores a negative charge when programmed and can be erased via Fowler-Nordheim tunneling.

The control gates of each memory cell T in the same row are connected together with a common word line $WL(\phi)$ ~$WL(n-1)$. The drains of each memory cell T in the same column are connected together with a common bit line $BL(\phi)$~$BL(n-1)$. The sources of all memory cells T are connected together with a source line 30. In the memory array 10, each row of memory cells T is connected with a self-limiting-erase floating gate transistor $TL(\phi)$~$TL(n-1)$ of the present invention. The control gates of the self-limiting-erase transistors TL are connected to the corresponding word lines WL, and the sources of the transistors TL are connected to the source line 30. The initial threshold voltage $V_{ti2}$ of the transistors TL is smaller than the initial threshold voltage $V_{ti1}$ of the memory cell transistors T For example, $V_{ti1}=1.0$ volts and $V_{ti2}=0$.

Different $V_{ti}$ values can be set during the manufacturing process of the memory array 10, for example by using the conventional process of ion implantation into the channel regions of the memory cell transistors T and the self-limiting-erase transistors TL. Another method to set the different Vti values is to program each memory cell after the flash memory IC is finished and before it is used to store data, so that its initial threshold voltage is larger than that of the self-limiting-erase transistors TL.

The operation voltages of the memory array 10 and the self-limiting-erase transistors TL in three modes of operation, i.e. programming, erasing, and read modes, are given in the following table where "F" means "floating."

| Mode of Operation | BL($\phi$) | BL(1) | BL(n − 1) | Vs | WL($\phi$) | WL(1) | WL(n − 1) | DRAIN OF TL($\phi$) | SOURCE OF TL($\phi$) |
|---|---|---|---|---|---|---|---|---|---|
| Program T($\phi$, $\phi$) | 7 V | 0 V | 0 V | 0 V | 12 V | 0 V | 0 V | 7 V | 0 V |
| Erase T($\phi$, $\phi$) ~ T($\phi$, n − 1) | F | F | F | 12 V | Connected to drain of TL($\phi$) | 12 V | 12 V | Connected to WL($\phi$) | 12 V |
| Read T($\phi$, $\phi$) | 1 V | 0 V | 0 V | 0 V | 5 V | 0 V | 0 V | F | 0 V |

As indicated in the table, if the user wants to selectively program the memory cell transistor T($\phi$,$\phi$), the bit line BL($\phi$) is held at 7 volts, and the other bit lines BL(1) through BL(n—1) are held at 0 volts. The voltage $V_s$ of the source line 30 is set to 0 volts. The word line WL($\phi$) is held at 12 volts, and the other word lines WL (1) through WL(n—1) are held at 0 volts. The drain of the self-limiting-erase transistor TL($\phi$) is held at 7 volts, and the source is held at 0 volts. In this manner, channel hot electrons are generated at the channel region of the memory cell transistor T($\phi$,$\phi$), and injected into its floating gate. Similarly, channel hot electrons are also generated in the channel region of the self-limiting-erase transistor TL($\phi$), and injected into its floating gate. Thus, both threshold voltages of the memory cell transistor T($\phi$,$\phi$) and the self-limiting-erase transistor TL($\phi$) are increased. For instance, after programming, the threshold voltage $Vtp_1$ of the memory cell transistor T($\phi$,$\phi$) is 6 volts, and the threshold voltage $V_{tp2}$ of the self-limiting-erase transistor TL($\phi$) is 5 volts. The preset voltage difference is maintained.

In an erase operation, this preferred embodiment can selectively erase only one row of memory cell devices. For example, if the first row of memory cell transistors T($\phi$, $\phi$) through T ($\phi$,n—1) is to be erased, the voltage $V_s$ of the source line 30 is set to 12 volts, and all bit lines are floating. The drain of the self-limiting-erase transistor TL($\phi$) is connected to the word line WL($\phi$) via a feedback path 32 with an initial reset value for the word line WL ($\phi$) equal to zero volt. In this embodiment, the feedback path 32 includes an impedance element 36. The other word lines WL(1) through WL(n—1) are held at 12 volts. In this manner, the charge stored in the floating gates of the first row of memory cell transistors T ($\phi$,$\phi$) through T ($\phi$, n—1) will be pulled out to the sources via capacitance coupling across the oxide between the floating gates and the sources. Similarly, the charge stored in the floating gate of the self-limiting-erase transistor TL($\phi$) will be pulled out to the source via capacitance coupling across the oxide between the floating gate and the source. Thus, the threshold voltages of the memory cells and the self-limiting-erase transistor will be reduced from their programmed values $V_{tp1}$, $V_{tp2}$ to their initial values $V_{ti1}$, $V_{ti2}$. When the threshold voltage of the self-limiting-erase transistor TL ($\phi$) reaches $V_{ti2}$=0 volt due to erasing, the transistor TL($\phi$) will turn on, and thus the erasing voltage of 12 volts at its source will transfer to the word line WL($\phi$) via the feedback path 32. This will stop the erase operation since now the voltage across the gate oxide between the floating gates and the sources is very small. At this point, the memory cells T($\phi$,$\phi$) through T($\phi$,n—1) all have a threshold voltage $V_{ti1}$=1 volts. Thus, the erase operation is self limited to completely avoid the over-erasing problem.

When the erased memory cell, for example the cell T($\phi$,$\phi$), is read, the bit line BL($\phi$) is held at 1 volts, and the other bit lines BL(1)~BL(n—1) are held at 0 volts. The voltage $V_s$ is set to 0 volts. The word line WL($\phi$) is held at 5 volts, and the other word lines WL(1)~WL (n—1) are held at 0 volts. The drain of the self-limiting-erase transistor TL($\phi$) is floating, and its source is held at 0 volts. As the threshold voltage of the cell T($\phi$,$\phi$) is constant and well known, a constant predetermined read current is delivered between its source and drain. Of course, when a programmed cell is read, there is no read current because the read voltage of 5 volts at the word line WL($\phi$) is less than $V_{tp1}$=6 volts of the cell.

Thus, memory array 10 of the present invention is very suitable for high speed applications which require constant high cell current. For a memory cell array with self-limiting erase, the threshold voltage $V_{ti1}$ of the memory cells can be preset to a low value, e.g. 0.5 volts or even 0.1 volts. A lower $V_{ti1}$ results in a higher read current. If the self-limiting erase scheme is not used, $V_{ti1}$ is higher, e.g. 1.5 volts, to provide more margin for preventing the cell devices from going into the depletion mode ($V_{ti1}$<0) after erase.

Figure 2:
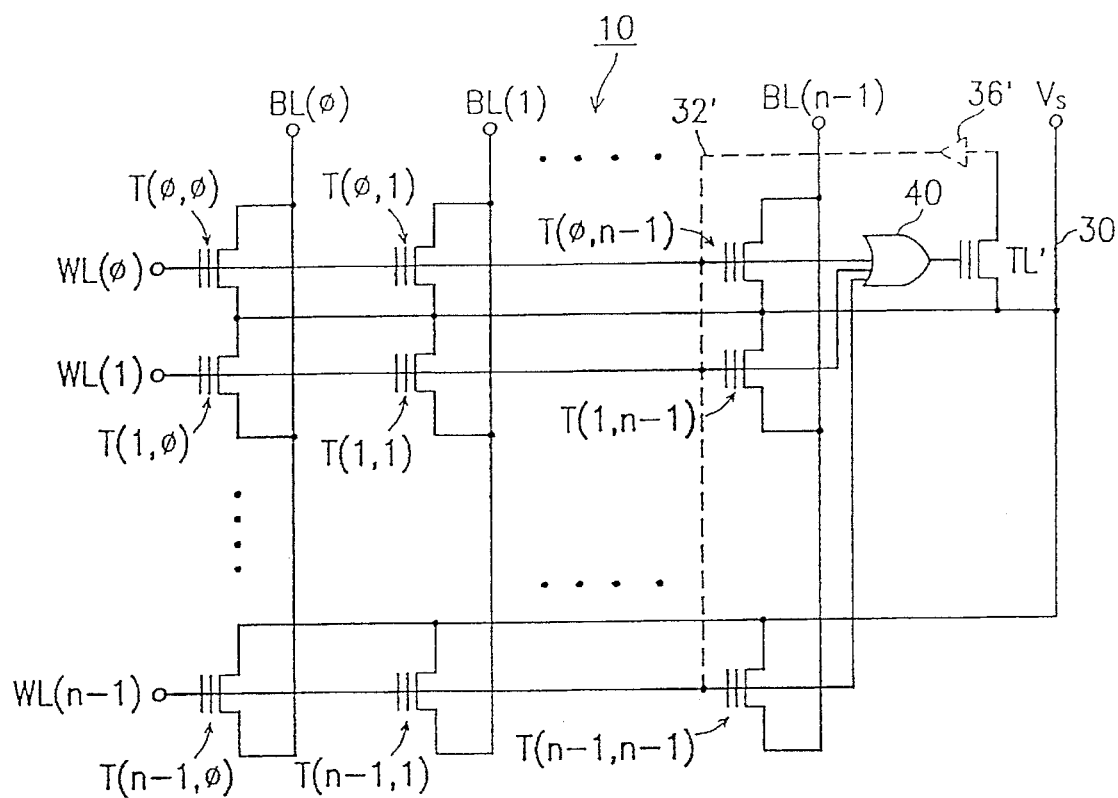
FIG. 2 is an electrical schematic diagram of a non-volatile memory array having a self-limiting erase to prevent over-erasure, according to another preferred embodiment of the present invention.

Referring now to FIG. 2, there is shown a schematic diagram of a flash memory cell array structure 10 with a self-limiting erase according to another preferred embodiment of the present invention. The above-described embodiment of FIG. 1 is suitable for memory array applications which need to selectively erase only one row of memory cells. If the erase operation of the memory array is to erase all rows of memory cells every time, only one self-limiting-erase floating gate transistor of the present invention is needed. As shown in FIG. 2, a self-limiting-erase transistor TL' is coupled to the memory cell array 10 with its source connected to the source line 30 and its control gate connected to the output terminal of a switching circuit, for example, an OR gate 40. All word lines WL($\phi$) through WL(n—1) of the memory array 10 are connected to the input terminals of the OR gate 40.

In an erase operation for all memory cells, the voltage $V_s$ of the source line 30 is set to 12 volts, and all bit lines are floating. The drain of the self-limiting-erase transistor TL' is connected to all word lines WL($\phi$) through WL(n—1) via a feedback path 32' with an initial reset value for the word lines WL($\phi$) through WL(n—1) equal to zero volts. In this embodiment, the feedback path 32' includes an impedance element 36'. In this manner, the charge stored in the floating gates of all memory cells will be pulled out to the sources. Similarly, the charge stored in the floating gate of the self-limiting-erase transistor TL' will be pulled out to the source. Thus, the threshold voltages of the memory cells and the self-limiting-erase transistor will be reduced from their programmed values $V_{tp1}$, $V_{tp2}$ to their initial values $V_{ti1}$, $V_{ti2}$. When the threshold voltage of the self-limiting-erase transistor TL' reaches $V_{ti2}$=0 volts due to erasing, the transistor TL' will turn on, and thus the erasing voltage of 12 volts at its source will transfer to all word lines WL($\phi$) through WL(n—1) via the feedback path 32'. This will stop the erase operation. At this point, all memory cells have a threshold voltage $V_{ti1}$=1 volt. Thus, the erase operation is also self limited to completely avoid the over-erasing problem. Furthermore, this embodiment also can obtain a constant read current in the read operation of an erased cell.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A non-volatile memory array comprising:

a plurality of memory cells arranged in rows and columns, each memory cell having a source, a drain, a floating gate and a control gate, the control gates of all memory cells in each row being interconnected by a word line, the drains of all memory cells in each column being interconnected by a bit line, and the sources of said memory cells being interconnected by a source line;

a plurality of self-limiting-erase floating gate transistors, one associated with each row of said memory cells, each of said self-limiting-erase floating gate transistors having a control gate coupled to the word line of its corresponding row, and a source coupled to said source line; and feedback means for connecting the drain of each of said self-limiting-erase floating gate transistors to its corresponding word line in order to limit the erase operation when its associated row of memory cells is erased.

2. The memory array as claimed in claim 1, wherein said feedback means includes an impedance element connected between the drain of each said self-limiting-erase floating gate transistor and its corresponding word line.

3. The memory array as claimed in claim 1, wherein said feedback means includes a feedback path for each row of said memory cells for connecting the drain of a self-limiting erase floating gate transistor to its corresponding word line when its associated row of said memory cells is erased.

4. The memory array as claimed in claim 3, wherein each of said feedback paths includes an impedance element connected between the drain of the corresponding self-limiting-erase transistor and the corresponding word line.

5. The memory array as claimed in claim 1, wherein said memory cells have a higher threshold voltage than that of said self-limiting-erase floating gate transistors.

6. The memory array as claimed in claim 5, wherein the difference between the threshold voltages of said memory cells and said self-limiting-erase floating gate transistors is in the range of about 0.1 to 1 volts.

7. The memory array as claimed in claim 5, wherein the threshold voltage difference is obtained by implanting ions of different dosages into channel regions of said memory cells and said self-limiting-erase floating gate transistors.

8. The memory array as claimed in claim 5, wherein the threshold voltage difference is obtained by electrically programming said memory cells to increase their threshold voltages.

9. The memory array as claimed in claim 1, wherein said memory array is a flash memory cell array.

10. The memory array as in claim 5, wherein said feedback means includes an impedance element connected between the drain of each of said self-limiting-erase floating gate transistor and its corresponding word line.

11. The memory array as in claim 5, wherein said feedback means includes a feedback path for each row of said memory cells for connecting the drain of a self-limiting-erase floating gate transistor to its corresponding word line when its associated row of said memory cells is erased.

12. The memory array as in claim 11, wherein each of said feedback paths includes an impedance element connected between the drain of the corresponding self-limiting-erase transistor and the corresponding word line.

13. The memory array as claimed in claim 5, wherein said memory array is a flash memory cell array.

* * * * *